United States Patent [19]

Hamano et al.

[11] Patent Number: 4,999,319
[45] Date of Patent: Mar. 12, 1991

[54] METHOD OF MANUFACTURING SEMICONDUCTOR DEVICE HAVING PACKAGE STRUCTURE

[75] Inventors: Toshio Hamano; Shigeo Natsume, both of Yokohama, Japan

[73] Assignee: Fujitsu Limited, Kawasaki, Japan

[21] Appl. No.: 333,810

[22] Filed: Apr. 6, 1989

Related U.S. Application Data

[63] Continuation of Ser. No. 225,578, Jul. 28, 1988, abandoned, which is a continuation of Ser. No. 27,935, Mar. 19, 1987, abandoned.

[30] Foreign Application Priority Data

Mar. 19, 1986 [JP] Japan .................... 61-059481

[51] Int. Cl.⁵ ........................... H01L 21/58
[52] U.S. Cl. ................... 437/209; 437/211; 437/224
[58] Field of Search ............ 437/209, 211, 215, 224, 437/214, 217

[56] References Cited

U.S. PATENT DOCUMENTS 4,493,143 1/1985 Maier .................. 437/209

FOREIGN PATENT DOCUMENTS 250158 5/1963 Australia .............. 437/209
58-14545 1/1983 Japan ................. 437/209

Primary Examiner—Olik Chaudhuri
Assistant Examiner—Andrew Griffin
Attorney, Agent, or Firm—Staas & Halsey

[57] ABSTRACT

A method of manufacturing a semiconductor device having a package structure including a lead base and a cap includes the steps of fixing a semiconductor chip to a lead base, and placing a fixation pellet in a cap, the fixation pellet being made of a material which melts and is subsequently hardened by a rise in temperature. The lead base carrying the semiconductor chip upside-down on the fixation pellet is placed in the cap. The fixation pellet between the cap and the lead base carrying the semiconductor chip is then heated to melt the fication pellet and subsequently harden the melted fixation pellet. Thus, the lead base carrying the semiconductor chip is fixed to the cap to form a package structure.

9 Claims, 16 Drawing Sheets

METHOD OF MANUFACTURING SEMICONDUCTOR DEVICE HAVING PACKAGE STRUCTURE

This is a continuation of co-pending application Ser. No. 225,578, filed on July 28, 1988 which is a continuation of U.S. Ser. No. 027,935, filed Mar. 9, 1987, now abandoned.

BACKGROUND OF THE INVENTION

1. Field of the Invention

The present invention relates to a method of manufacturing a semiconductor device having a package structure including a lead base and a cap. The method according to the present invention is applicable to the production of IC packages in the form of, for example, a pin grid array (PGA), a dual in line package (DIP), and a leadless chip carrier (LCC).

2. Description of the Related Arts

In general, a lead base for a semiconductor device having a package structure is made of highly heatproof thermosetting plastics such as heatproof epoxy resin, bismaleimide-triazine resin (BT resin) or polyimide resin. The lead base has a square shape in plan view, and a groove for mounting a semiconductor chip is provided in the center of the lead base. A barrier for preventing sealing plastics from reaching the side portion of the lead base is provided on the top surface of the lead base. Pins are provided at the bottom of the lead base, and these pins are connected to the semiconductor chip through wires.

In the production of the package structure, a liquid plastic for filling is disposed within a barrier on the top surface of the lead base including the groove, and the disposed filling plastic is hardened by curing. A thermosetting plastic solution such as an epoxy resin solution is used as the filling plastic, and the curing is carried out by raising the temperature.

Then, a thermosetting plastic solution for fixation similar to the filling plastic is disposed in the upside-down turned cap. The depth of the plastic solution for fixation becomes uniform with a lapse of time, and the device is turned upside-down and is fitted into the cap containing the plastic solution for fixation.

Then, the plastic solution for fixation is hardened by curing at an elevated temperature to fix the cap to the device, and thus a package is produced.

However, a problem in the prior art production of the package structure is that the step of making the depth of the plastic solution for fixation uniform with a lapse of time is troublesome, a perfect uniformity of the depth of the plastic solution for fixation is difficult to realize, and voids are apt to be generated in edge portions, which voids reduce the effective length of the water creepage path and thus deteriorate the waterproofing characteristic. If such a water creepage occurs, a conductor in the electrical circuit of the device may be blown, and if water creeps into the voids in the edge portions, a leakage of current or a short-circuit may occur.

There is also a problem in that creeping of melted solder into the voids may occur, and there is a further problem in that the hardened plastic for fixation between the cap and the lead base may be forced out, to deteriorate the quality of the package structure as a product.

SUMMARY OF THE INVENTION

It is an object of the invention to provide an improved method of manufacturing a semiconductor device having a package structure including a lead base and a cap for producing a high quality package structure at a relatively low cost by using a relatively simple process.

In accordance with the present invention, there is provided a method of manufacturing a semiconductor device having a package structure including a lead base and a cap including the steps of: fixing a semiconductor chip to a lead base; placing a pellet for fixation in a cap, the pellet for fixation being made of material which melts and is subsequently hardened by a temperature rise; and placing the lead base carrying the semiconductor chip upside-down on the pellet for fixation in the cap. Then, heating of the pellet for fixation between the cap and the lead base carrying the semiconductor chip is carried out to melt the pellet for fixation and subsequently harden the melted pellet for fixation. Thus, the lead base carrying the semiconductor chip is fixed to the cap to form a package structure.

DESCRIPTION OF THE PREFERRED EMBODIMENTS ((Description Concerning FIGS. 1A to 1D))

Before describing preferred embodiments of the present invention, a prior art method of manufacturing a semiconductor device having a package structure is described with reference to FIGS. 1A to 1D.

Figure 1A:
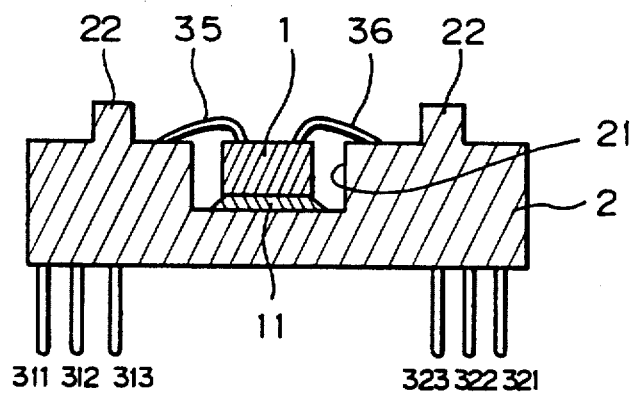
FIGS. 1A to 1D show a prior art method of manufacturing a semiconductor device having a package structure.

In FIG. 1A, the lead base 2 is made of a highly heatproof plastic such as a heatproof epoxy resin, or of a thermosetting plastic such as bismaleimide-triazine resin (BT resin) or polyimide resin. The lead base 2 has a square shape in plan view. A groove 21 for mounting the semiconductor chip 1 is provided in the center of the lead base 2, and the semiconductor chip 1 is fixed to the bottom of the groove 21 by silver paste 11. A barrier 22 for preventing the sealing plastics 71 from reaching the side portion of the lead base 2 is provided on the top surface of the lead base 2. Pins 311, 312, 313; 321, 322, and 323 are provided at the bottom of the lead base 2, and these pins are connected to the semiconductor chip 1 through wires 35 and 36.

Figure 1B:
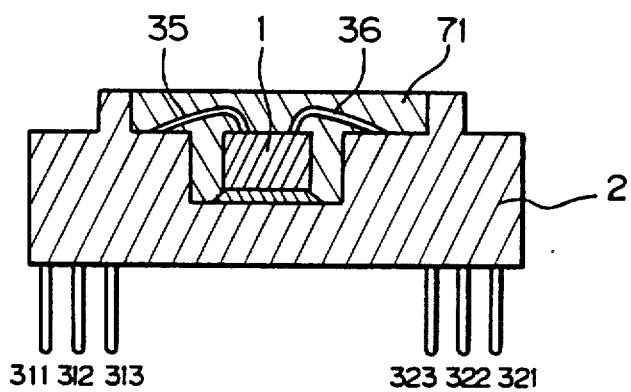

In the production of the package structure, the liquid plastic 71 for filling is disposed within the barrier 22 on the top surface of the lead base 2 including the groove 21, as shown in FIG. 1B. The disposed filling plastic 71 is hardened by curing. A thermosetting plastic solution such as an epoxy resin solution is used as the filling plastic 71, and is cured by raising the temperature.

Figure 1C:
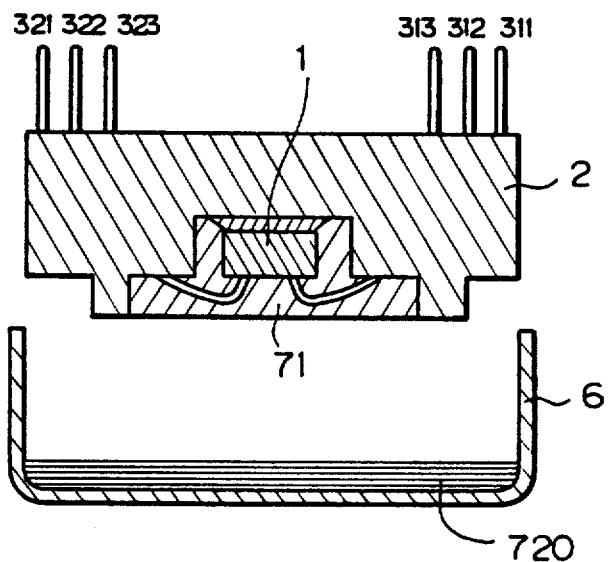

Then, a thermosetting plastic solution 720 for fixation similar to the filling plastic 71 is disposed in the upside-down cap 6 as shown in the lower portion of FIG. 1C. The depth of the plastic fixation solution 720 becomes uniform with time. The device shown in FIG. 1B is turned upside-down as shown in the upper portion of FIG. 1C and is fitted into the cap 6 containing the plastic fixation solution 720.

Figure 1D:
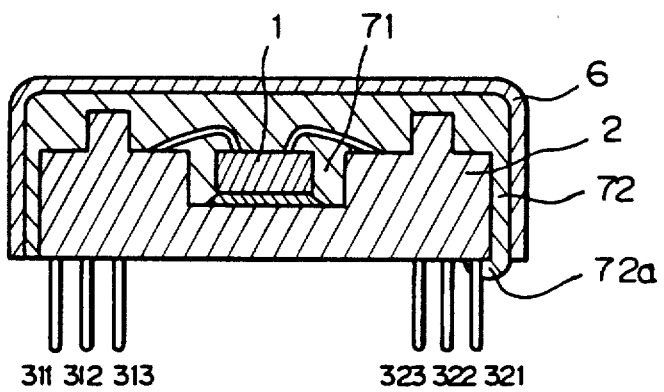

Then, the plastic fixation solution is hardened by curing at an elevated temperature to fix the cap 6 to the device; thus producing the package structure shown in FIG. 1D. At this time, the hardened fixation plastic 72 between the cap 6 and the lead base 2 is forced out as shown in the portion 72a.

((Embodiment of FIGS. 2A to 2D))

Figure 2A:
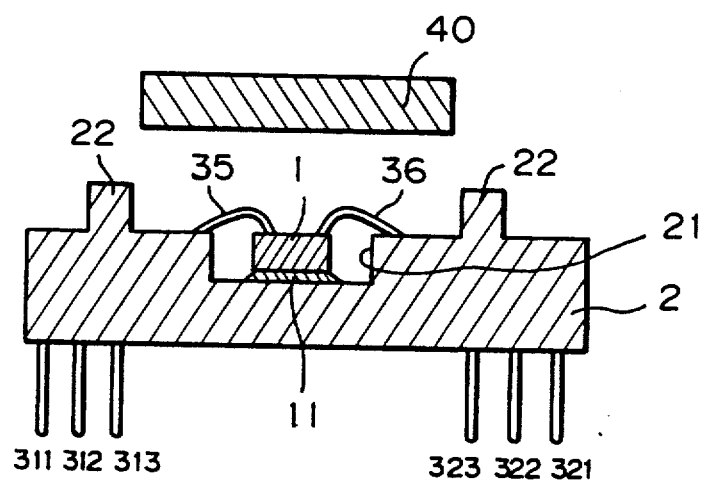
FIGS. 2A to 2D show a method of manufacturing a semiconductor device having a package structure in accordance with an embodiment of the present invention.
Figure 3:
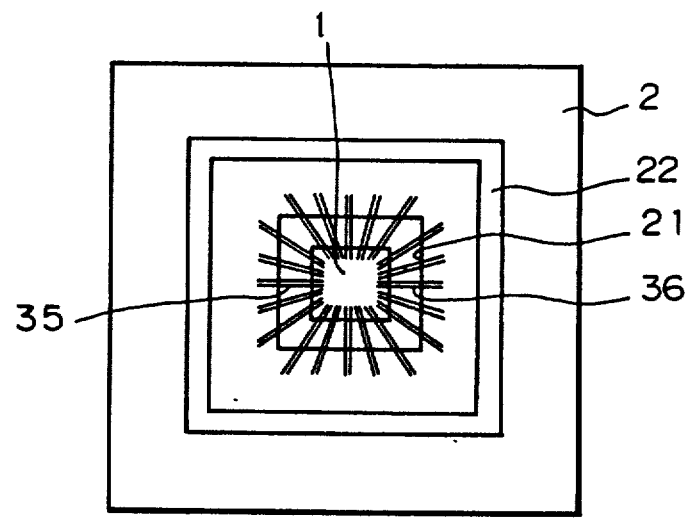
FIG. 3 shows a plan view of a lead base used in the processes shown in FIGS. 2A to 2D.

A method of manufacturing a semiconductor device having a package structure in accordance with an embodiment of the present invention will be described with reference to FIGS. 2A to 2D;

In FIG. 2A, the lead base 2 is made of a highly heatproof thermosetting plastic such as a heatproof epoxy resin, bismaleimide-triazine resin (BT resin) or polyimide resin, or ceramics such as alumina, silicon carbide, aluminum nitride, or mullite. The lead base 2 has a square shape in plan view, as shown in FIG. 3. The groove 21 for mounting the semiconductor chip 1 is provided in the center of the lead base 2. The barrier 22 for preventing the filling plastics pellet 40 from reaching the side portion of the lead base 2 when melted is provided on the top surface of the lead base 2. The pins 311, 312, 313; 321, 322, and 323 are provided at the bottom of the lead base 2, and are connected to the semiconductor chip 1 through the wires 35 and 36 made of, for example, gold or aluminum.

Figure 4A:
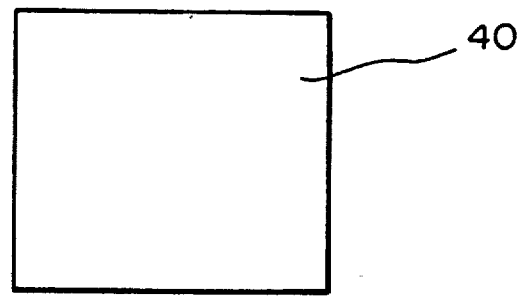
FIGS. 4A and 4B show plan views of the pellet for filling and the pellet for fixation used in the processes shown in FIGS. 2A to 2D.

The filling pellet 40 is placed within the barrier 22 on the top surface of the lead base 2. The filling pellet 40 is made of a thermosetting plastic such as an epoxy resin, for example, E-pellet 6050 manufactured by Nitto Denko K.K. (Nitto Electrical Industry Co.) The size of the E-pellet 6050 is an epoxy resin of the B-stage (representative of the degree of hardening among A, B and C stages) filling pellet 40 is such that, when the plastic is melted by a rise in temperature, the melted plastic occupies the entire space within the barrier 22, including the groove 21. The material of the filling pellet 40 is preferably selected to be a plastic having a low viscosity, low thermal stress, and anti-thermal-mismatch property when melted, to enable the melted plastic to fill the corner portions of the groove 21 without exerting excessive force on the wires 35 and 36. A plan view of the filling pellet 40 is shown in FIG. 4A.

Figure 2B:
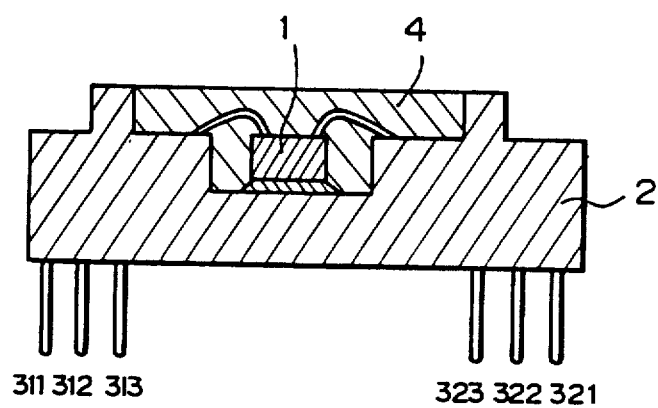

The filling pellet 40 is melted on the top surface of the lead base 2 and hardened by curing to form the plastic sealing 4 as shown in FIG. 2B.

Figure 2C:
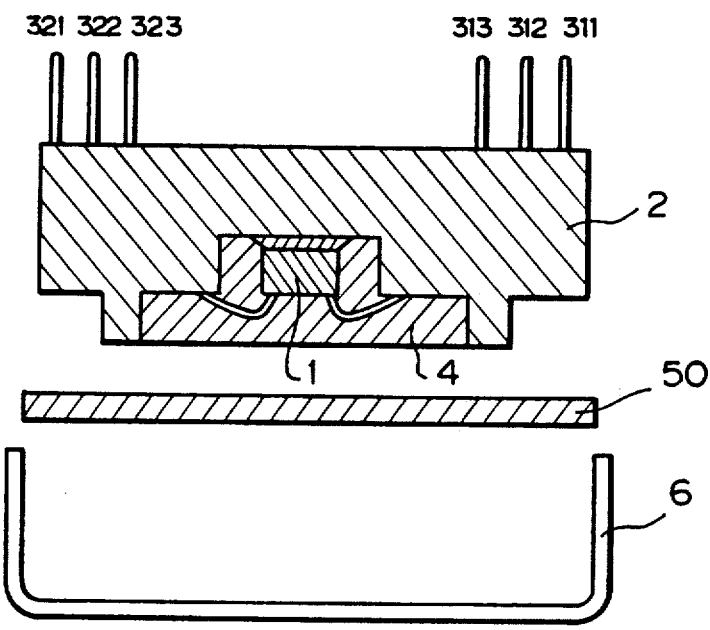
Figure 4B:
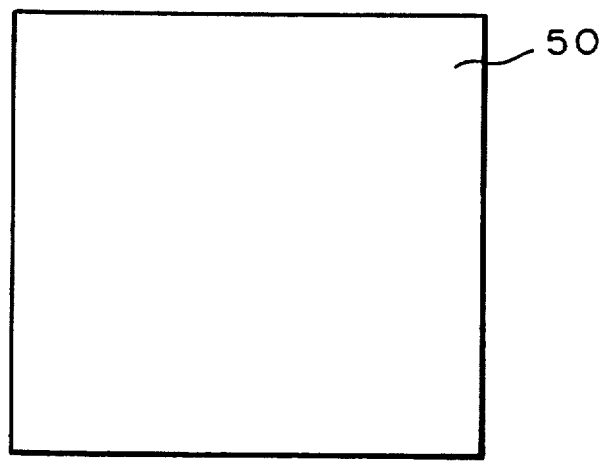

Then the thermosetting plastic fixation pellet 50 is placed in the upside-down cap 6 as shown in the lower portion of FIG. 2C. The device shown in FIG. 2B is turned upside-down as shown in the upper portion of FIG. 2C and is fitted into the cap 6 containing the fixation pellet 50. The fixation pellet 50 is, for example, an F-pellet 6050 manufactured by Nitto Denko K.K., or Ablefilm 564 manufactured by Ablestik Co. The F-pellet 6050 is a B-stage type film-like epoxy resin applied to a non-woven glass sheet. A plan view of the fixation pellet 50 is shown in FIG. 4B. The thickness of the fixation pellet 50 is about 0.8 to 1.2 mm.

Figure 2D:
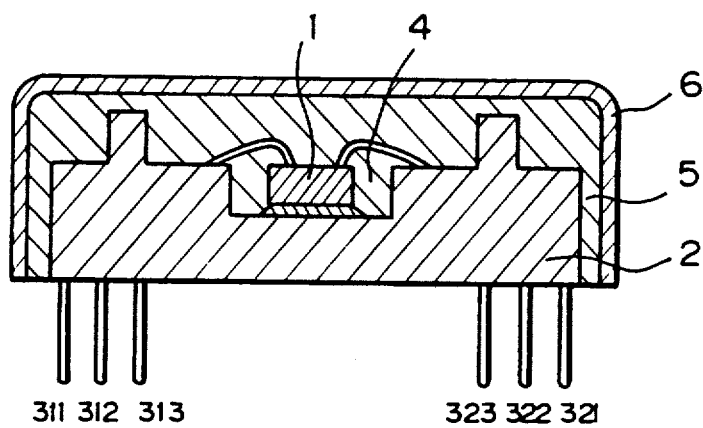

By heating, for example, for 15 to 20 hours, the cap 6 is fixed to the device through the hardened plastic to produce the package structure shown in FIG. 2D.

((Embodiment of FIGS. 5A to 5D))

A method of manufacturing a semiconductor device having a package structure in accordance with another embodiment of the present invention will be described with reference to FIGS. 5A to 5D.

Figure 5A:
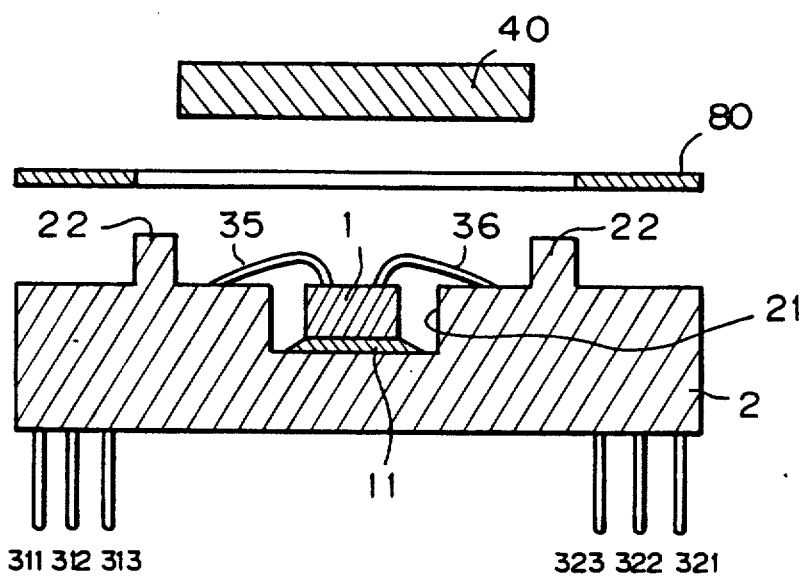
FIGS. 5A to 5D show another embodiment of the present invention.

In FIG. 5A, the lead base 2 is made of a highly heatproof plastic such as a heatproof epoxy resin, a thermosetting plastic such as bismaleimide-triazin resin (BT resin) or polyimide resin, or ceramics such as alumina, silicon, carbide, aluminum nitride, or mullite. The lead base 2 has a square shape in plan view as similarly shown in FIG. 3. The groove 21 for mounting the semiconductor chip 1 is provided in the center of the lead base 2, and the semiconductor chip 1 is fixed to the groove 21 by silver paste 11.

The barrier 22 for preventing the melted filling pellet 40 from reaching the side portion of the lead base 2 when melted is provided on the top surface of the lead base 2. The pins 311, 312, 313; 321, 322, and 323 are provided at the bottom of the lead base 2, and are connected to the semiconductor chip 1 through the wires 35 and 36 made of, for example, gold or aluminum.

Figure 6A:
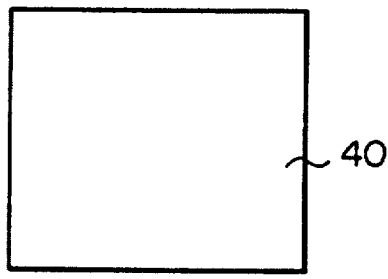
FIGS. 6A to 6C show plan views of the pellets used in the processes shown in FIGS. 5A to 5D.

The filling pellet 40 is then placed within the barrier 22 on the top surface of the lead base 2. The filling pellet 40 is made of a thermosetting plastic such as an epoxy resin, for example, E-pellet 6050 manufactured by Nitto Denko K.K. The size of the filling pellet 40 is such that when the plastic is melted by a rise in temperature, the melted plastic occupies the entire space within the barrier 22, including the groove 21. The material of the filling pellet 40 is preferably selected to be a plastic having a low viscosity, low thermal stress, and anti-thermal-mismatch property when melted, to enable the melted plastic to fill the corner portions of the groove 21 without exerting excessive force on the wires 35 and 36. A plan view of the filling pellet 40 is shown in FIG. 6A.

Figure 6B:
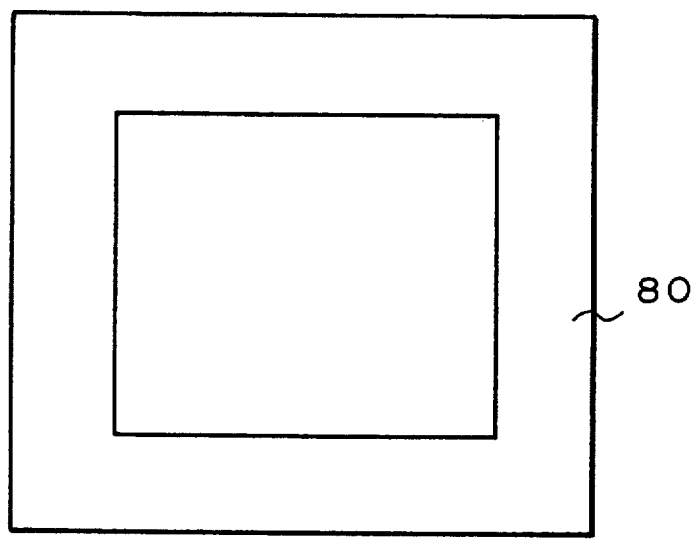

Then, a frame pellet 80 for the preliminary sealing is placed outside the barrier 22 on the peripheral top surface of the lead base 2. The frame pellet 80 is, for example, an F-pellet 6050 manufactured by Nitto Denki Kogyo K.K. applied to a non-woven glass sheet and having a thickness of about 40 μm to 200 μm. A plan view of the frame pellet 80 is shown in FIG. 6B. The thickness of the frame pellet 80 is about 0.2 mm to 0.5 mm.

Figure 5B:
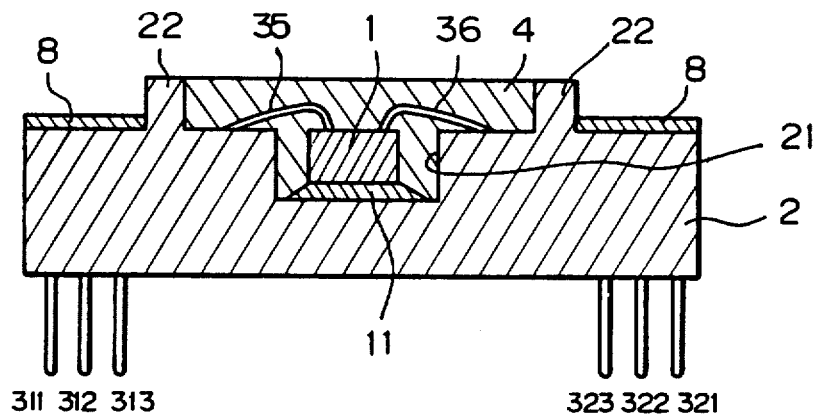

The filling pellet 40 and the frame pellet 80 are then melted on the top surface of the lead base 2 and hardened by curing to form the filling plastic 4 and the preliminary sealing layer 8 as shown in FIG. 5B.

Figure 5C:
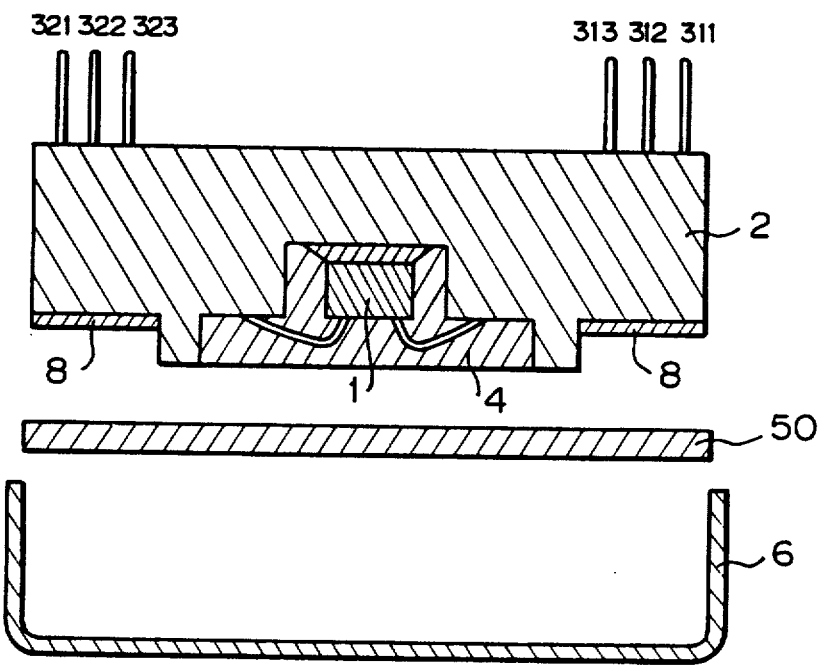
Figure 6C:
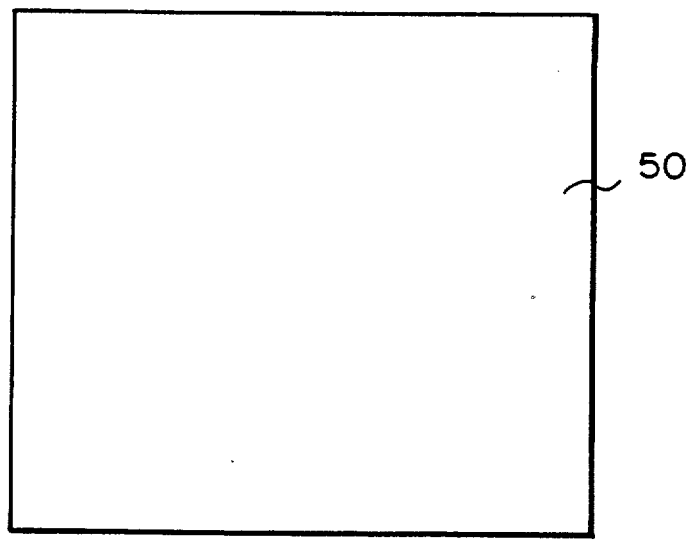

Then, the thermosetting plastic fixation pellet 50 is placed in the upside-down turned cap 6 as shown in the lower portion of FIG. 5C. The device shown in FIG. 5B is turned upside-down as shown in the upper portion of FIG. 5C and is fitted into the cap 6 containing the fixation pellet 50. The fixation pellet 50 is, for example, an F-pellet 6050 manufactured by Nitto Denki Kogyo K.K. and applied to a non-woven glass sheet. A plan view of the fixation pellet 50 is shown in FIG. 6C. The thickness of the fixation pellet 50 is about 0.5 mm to 1.0 mm.

Figure 5D:
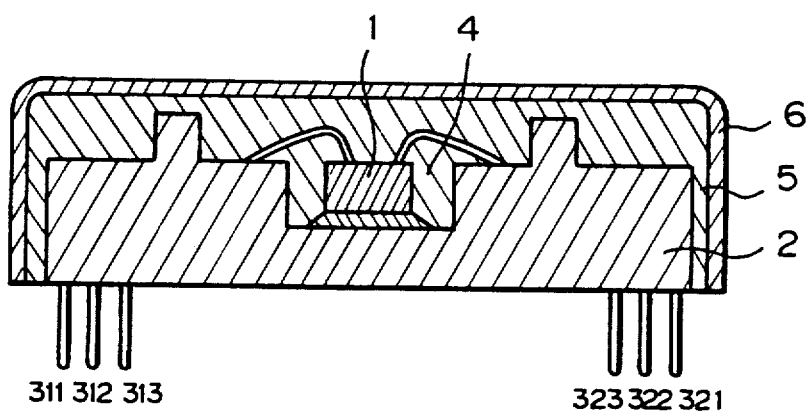

Thus, by raising the temperature, the cap 6 is fixed to the device through the hardened plastic to produce the package structure shown in FIG. 5D.

((Embodiment of the FIGS. 7A to 7D))

A method of manufacturing a semiconductor device having a package structure in accordance with another embodiment of the present invention will be described with reference to FIGS. 7A to 7D.

Figure 7A:
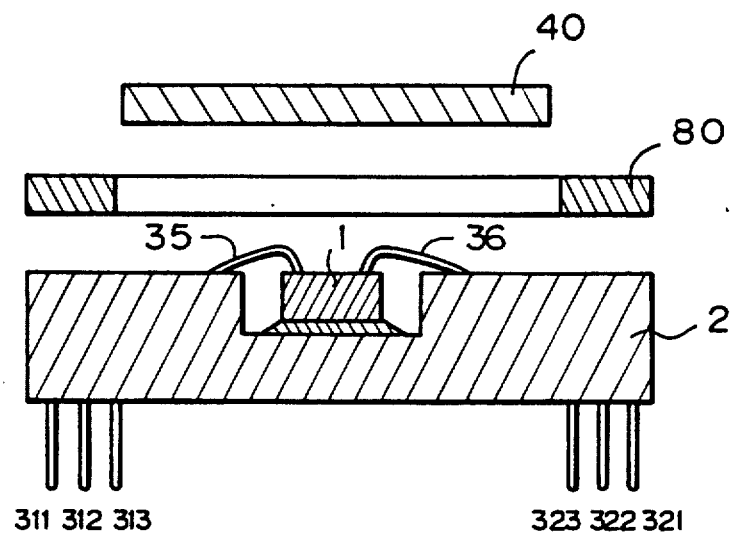
FIGS. 7A to 7D show another embodiment of the present invention.
Figure 8A:
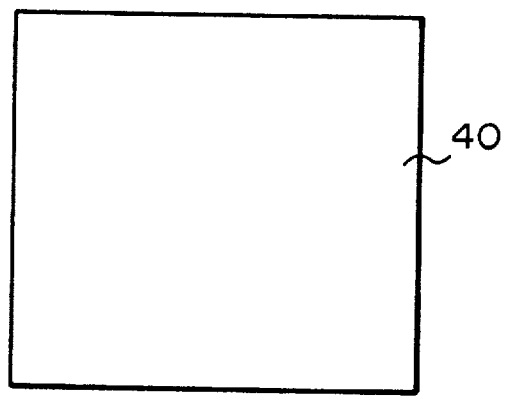
FIGS. 8A to 8C show plan views of the pellet used in the processes shown in FIGS. 7A to 7D.
Figure 8B:
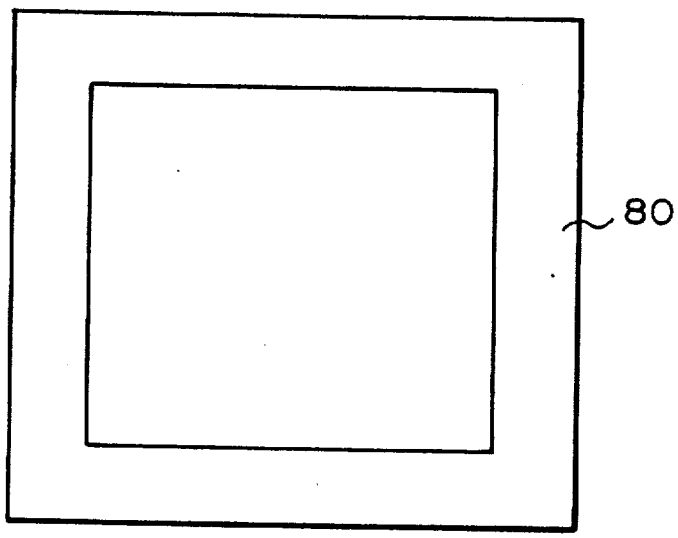

In FIG. 7A, the filling pellet 40 and the frame pellet 80 for the barrier formation are placed on the top-surface of the lead base 2. The materials of the filling pellet 40 and the frame pellet 80 are similar to those of the filling pellet 40 and the frame pellet 80 in the case of FIG. 5A. Plan views of the filling pellet 40 and the frame pellet 80 of FIG. 7A are shown in FIGS. 8A and 8B. The thickness of the frame pellet 80 is about 0.3 mm to 0.7 mm.

Figure 7B:
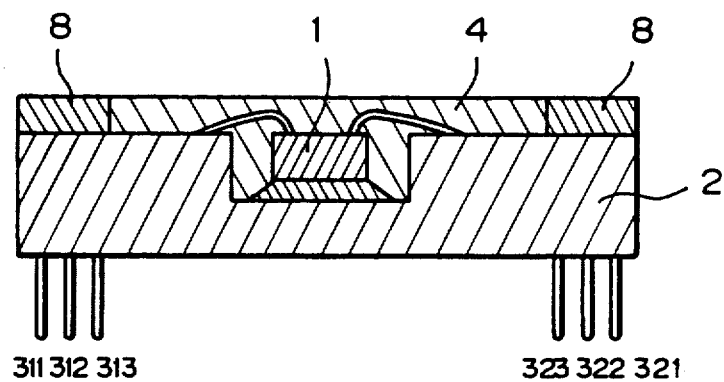

Thus, by a temperature rise, the frame pellet 80 is melted and hardened to be fixed to the lead base 2 to form the substantive barrier 8 for the filling pellet 40 to be melted within the range surrounded by the frame pellet 80. Thus, the filling by the melted and hardened plastic 4 is carried out as shown in FIG. 7B.

Figure 7C:
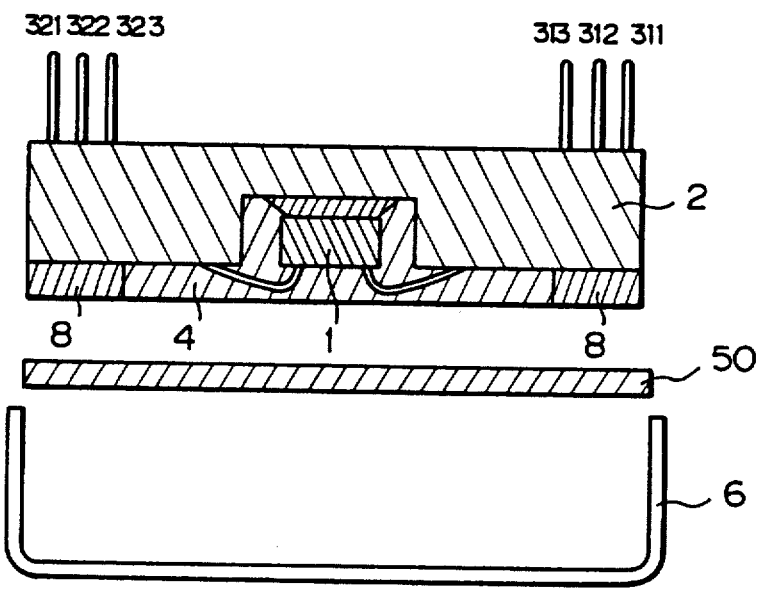
Figure 8C:
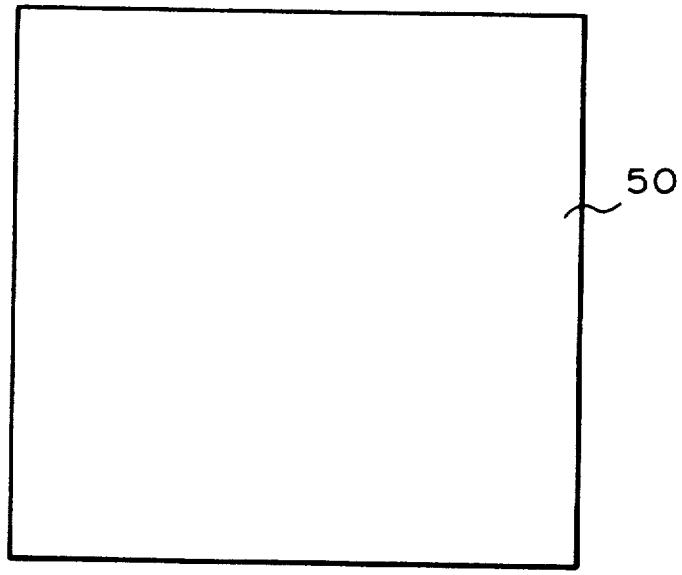

Then, the thermosetting plastic fixation pellet 50 is placed in the upside-down turned cap 6 as shown in the lower portion of FIG. 7C. The device shown in FIG. 7B is turned upside-down as shown in the upper portion of FIG. 7C and is fitted into the cap 6 containing the fixation pellet 50. The material of the fixation pellet 50 is similar to that in the case of FIG. 2C. A plan view of the fixation pellet 50 is shown in FIG. 8C. The thickness of the fixation pellet 50 is about 0.2 mm to 0.5 mm.

Figure 7D:
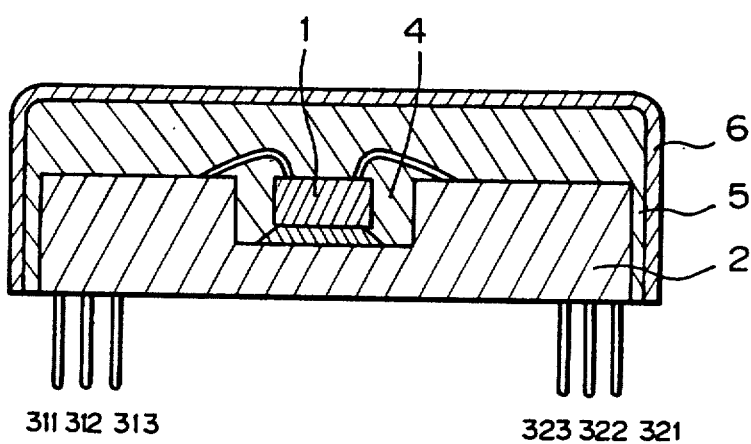

Thus, by a temperature rise, the cap 6 is fixed to the device through the hardened plastic to produce the package structure shown in FIG. 7D.

Figure 9:
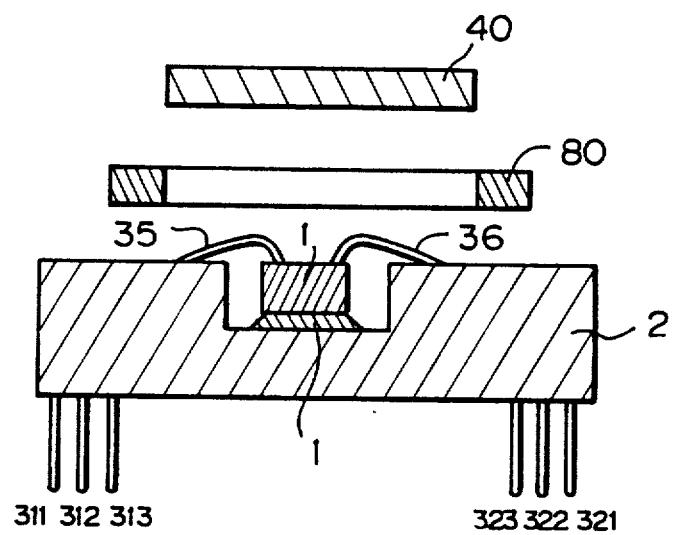
FIG. 9 shows another embodiment of the present invention.

Instead of the arrangement shown in FIG. 7A, it is possible to adopt the arrangement shown in FIG. 9. The thickness of the frame pellet 80 is similar to that in FIG. 7A.

((Embodiment of FIGS. 10A to 10D))

A method of manufacturing a semiconductor device having a package structure in accordance with another embodiment of the present invention will be described with reference to FIGS. 10A to 10D.

Figure 10A:
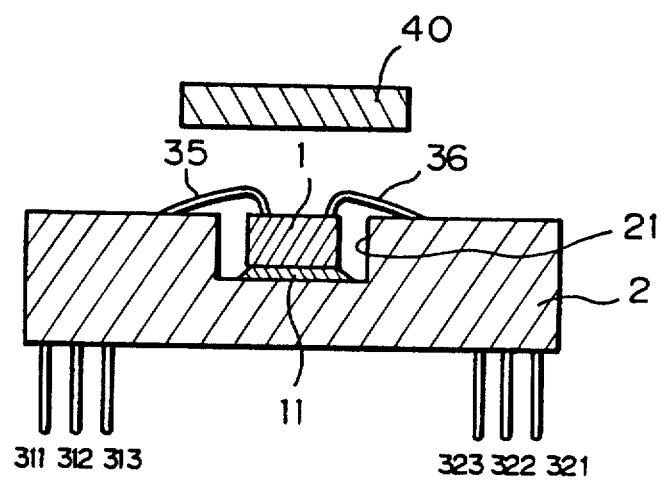
FIGS. 10A to 10D show still another embodiment of the present invention.

In FIG. 10A, the filling pellet 40 is placed on the center of the top surface of the lead base 2, including the groove 21. The material of the filling pellet 40 is similar to that in the cases of FIGS. 2A, 5A, 7A, and 9.

Figure 10B:
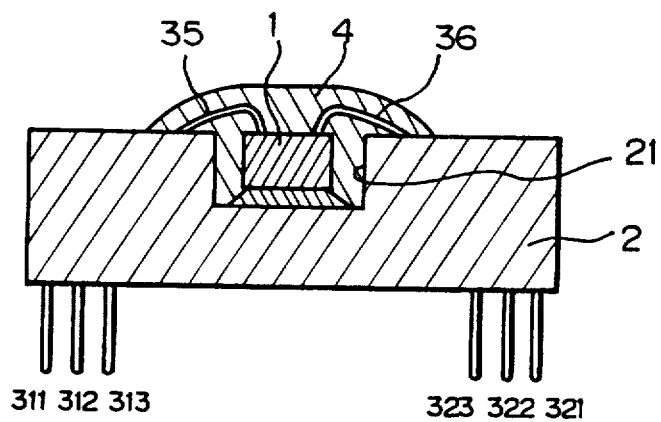

Thus, by a temperature rise, the sealing of the central portion of the device including the groove 21, the semiconductor chip 1, and the wires 35 and 36 is carried out to form a hill-shaped plastic filling 4 as shown in FIG. 10B.

Figure 10C:
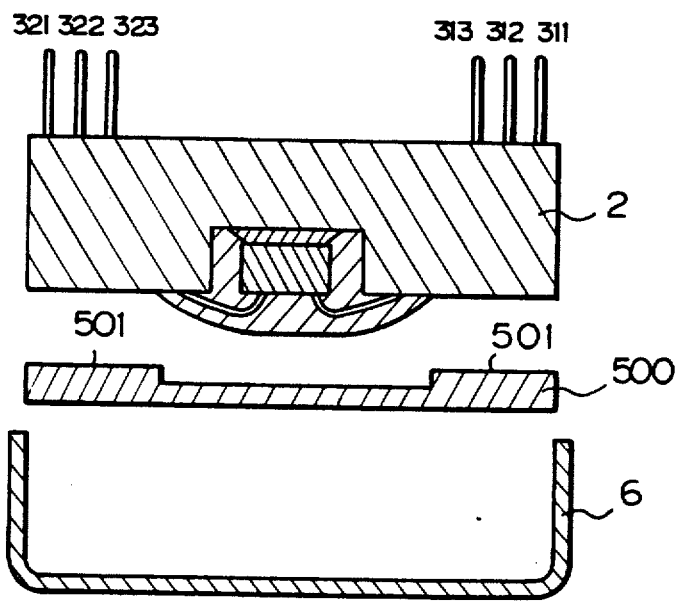

Then the fixation pellet 500 having a projecting portion 501 is placed in the upside-down turned cap 6 as shown in the lower portion of FIG. 10C. The device shown in FIG. 10B is turned upside-down as shown in the upper portion of FIG. 10C as is fitted into the cap 6 containing the fixation pellet 500. The material of the fixation pellet 500 is similar to that in the cases of FIGS. 2A, 5A, 7A, and 9. The thickness of the central part of the fixation pellet 500 is about 0.3 mm to 0.7 mm. The thickness of the projecting portion 501 is about 0.8 mm to 1.2 mm.

Figure 10D:
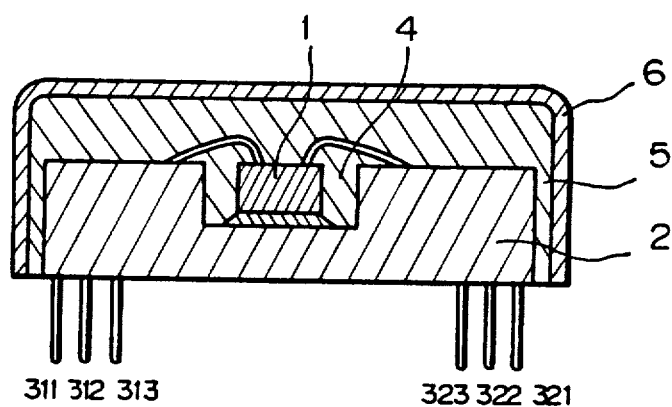

Thus, by raising the temperature, the cap 6 is fixed to the device through the hardened plastic to produce the package structure shown in FIG. 10D.

((Embodiment of FIGS. 11A to 11D))

A method of manufacturing a semiconductor device having a package structure in accordance with a further embodiment of the present invention will be described with reference to FIGS. 11A to 11D.

Figure 11A:
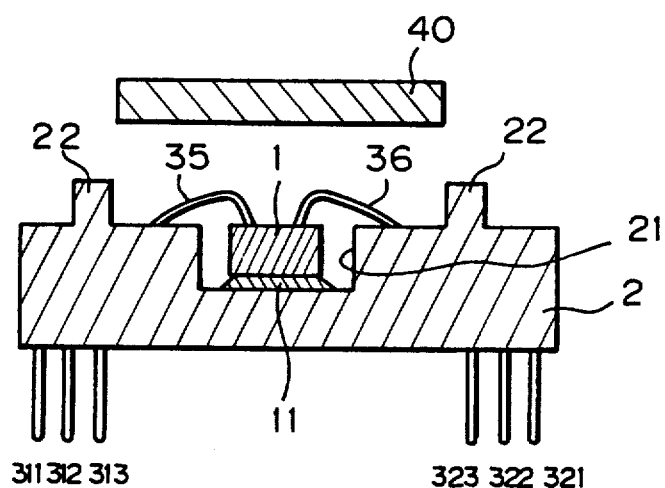
FIGS. 11A to 11D show a further embodiment of the present invention.

In FIG. 11A, the filling pellet 40 is placed within the barrier 22 on the top surface of the lead base 2. The material of the filling pellet 40 is similar to that in the cases of FIGS. 2A, 5A, 7A, 9, and 10A.

Figure 11B:
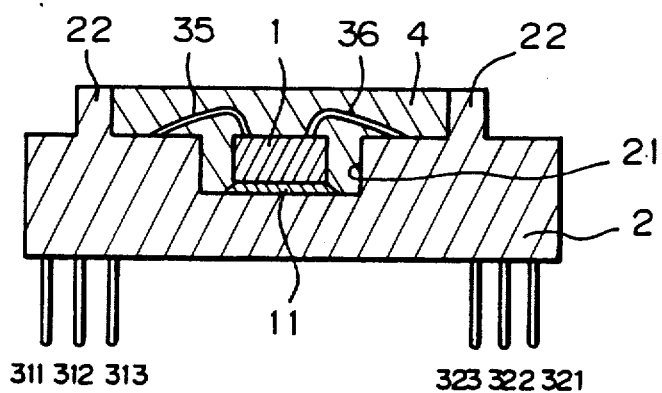

Then, the filling pellet 40 is melted on the top surface of the lead base 2 and hardened by curing to form the plastic filling 4 as shown in FIG. 11B.

Figure 11C:
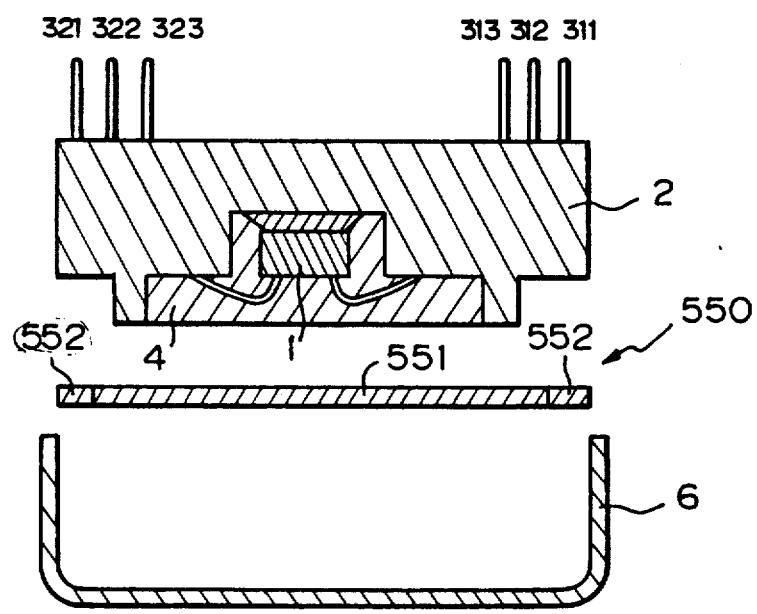

Then the fixation pellet 550 is placed in the upside-down turned cap 6 as shown in the lower portion of FIG. 11C. The device shown in FIG. 11B is turned upside-down as shown in the upper portion of FIG. 11C and is fitted into the cap 6 containing the fixation pellet 550.

Figure 12:
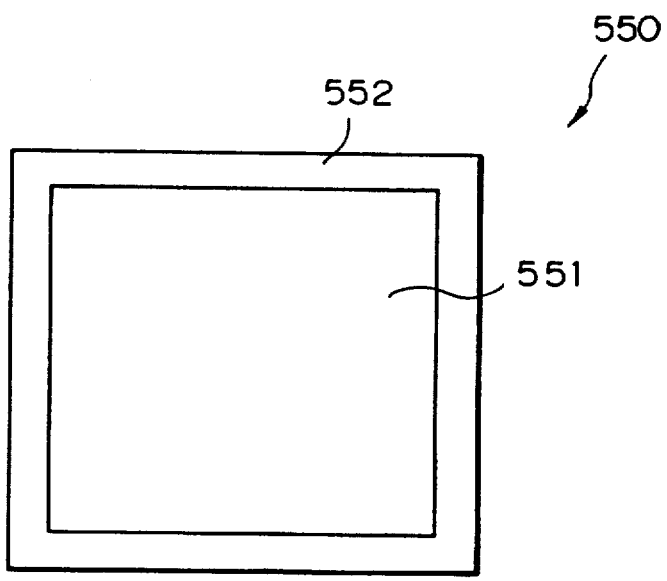
FIG. 12 shows a plan view of the pellet used in the processes shown in FIGS. 11A to 11D.

The fixation pellet 550 is constituted by a resin and non-woven glass sheet portion 551 made of, for example, an epoxy resin such as an E-pellet 6050 manufactured by Nitto Denko K.K., and a non-woven glass sheet 551, and an exclusive non-woven glass sheet portion 552 without plastic surrounding the plastic and non-woven glass sheet portion 551. A plan view of the fixation pellet 550 is shown in FIG. 12.

Figure 11D:
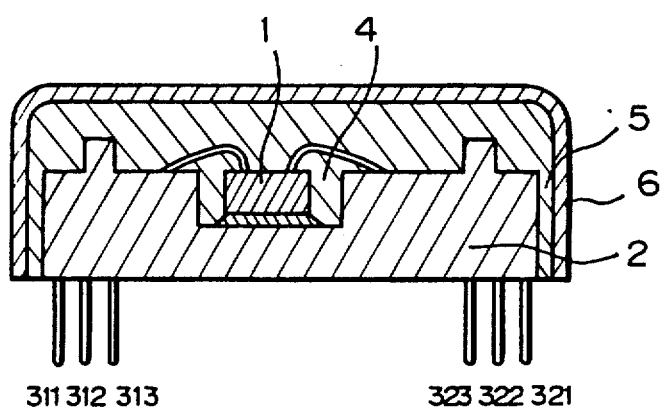

Thus, by raising the temperature, the cap 6 is fixed to the device through the hardened plastic to produce the package structure shown in FIG. 11D. The glass-sheet-only portion 552 serves to absorb the melted plastic when the temperature is raised, so that an extrusion of the melted plastic to the outside of the configuration of the package structure of FIG. 11D is prevented.

We claim:

1. A method of manufacturing a semiconductor device having a package structure comprising a lead base having a planar shape and having an upper face and lower face, a semiconductor chip being fixed to the upper face, and a cap having a recess therein having a flat bottom surface, for accommodating the planar lead base, said method comprising the steps of:
   (a) fixing a semiconductor chip to a groove formed in the lead base;
   (b) forming wires for connecting the semiconductor chip to the lead base;
   (c) placing a flat pellet including a plastic over the wires, lead base, and semiconductor chip;
   (d) melting the flat pellet so as to entirely fill the groove and to cover the wires;
   (e) placing a flat fixation pellet on the bottom surface in the cap, the flat fixation pellet, having a substantially planar shape and an area equal to the area of the bottom surface of the cap, being made of material which melts and subsequently hardens by a rise in temperature;

(f) placing the lead base carrying the semiconductor chip upside-down on the flat fixation pellet in the cap; and (g) heating the flat fixation pellet between the cap and the lead base carrying the semiconductor chip to melt the flat fixation pellet and subsequently harden the melted fixation pellet, the lead base carrying the semiconductor chip being fixed to the cap to form a package structure.

2. A method according to claim 1, wherein said steps (b)–(d) are carried out within an area defined by a barrier formed on the surface of the lead base.

3. A method according to claim 2, wherein the barrier is a part of the lead base.

4. A method according to claim 1, further comprising the steps of:

(h) placing a frame pellet on a periphery of a top surface of the lead base and under the pellet containing a plastic; and (i) heating the frame pellet to melt the frame pellet and subsequently harden the melted frame pellet to fix the hardened frame pellet to the lead base.

5. A method according to claim 1, wherein the planar size of the frame pellet for forming the barrier is smaller than the planar size of the lead base.

6. A method according to claim 2, wherein said step (f) includes placing the fixation pellet in the cap formed of a plastic and non-woven glass sheet portion and an exclusive non-woven glass sheet portion surrounding the plastic and non-woven glass sheet portion.

7. A method according to claim 1, wherein said step (c) includes placing the pellet containing plastic inside a periphery of the top surface of the lead base designated by a barrier.

8. A method according to claim 1, further comprising the step of forming a barrier by melting a frame pellet and simultaneously fixing the melted frame pellet to the lead base.

9. A method of manufacturing a semiconductor device having a package structure comprising a lead base having a planar shape and having an upper face and lower face, a semiconductor chip being fixed to the upper face and a cap having a recess therein having a flat bottom surface, for accommodating the planar lead base, said method comprising the steps of:

(a) fixing a semiconductor chip within an area defined by a barrier formed on the upper surface of the lead base;

(b) forming wires for connecting the semiconductor chip to the lead base;

(c) placing a flat pellet including a plastic over the wires, lead base, and semiconductor chip;

(d) melting the flat pellet so as to entirely fill the area defined by the barrier and to cover the wires;

(e) placing a flat fixation pellet on the bottom surface in the cap, the flat fixation pellet, having a substantially planar shape and an area equal to the area of the bottom surface of the cap, being made of a material which melts and subsequently hardens by a rising temperature;

(f) placing the lead base carrying the semiconductor chip upside down on the flat fixation pellet in the cap; and (g) heating the flat fixation pellet between the cap and the lead base carrying the semiconductor chip to melt the flat fixation pellet and subsequently harden the melted fixation pellet, the lead base carrying the semiconductor chip being fixed to the cap to form a package structure.

* * * * *

UNITED STATES PATENT AND TRADEMARK OFFICE
CERTIFICATE OF CORRECTION

PATENT NO. : 4,999,319

DATED : MARCH 12, 1991

INVENTOR(S) : TOSHIO HAMANO ET AL.

It is certified that error appears in the above-identified patent and that said Letters Patent is hereby corrected as shown below:

Title page, Col. 2, line 3, delete this line in its entirety and substitute the following:

--3,706,840  12/1972  Moyle et al. ..... 174/52PE
  4,218,701   8/1980  Shirasaki ........ 357/72
  4,493,143   1/1985  Maier ............ 437/209--.

Title page, Col. 2, delete lines 5 and 6 in their entirety and substitute the following:

--0017936            1985   Japan ........... 29/588
  0032736    4/1981         Japan ........... 437/224
  0080258            1985   Japan ........... 357/80
  0111431            1985   Japan ........... 174/52PE
  0139924    5/1985         Europe .......... 29/837
  0144758   11/1975         Japan ...........
  0159547            1984   Japan ........... 29/588
  0172324            1985   Europe .......... 29/588
  250158     5/1963         Australia ....... 432/209
  58-14545   1/1983         Japan ........... 437/209

OTHER PUBLICATIONS

PATENT ABSTRACTS OF JAPAN, Vol. 8, No. 277 (E-285) (1714); 12/18/84; & JP-A-59 145534 (MATSUSHITA DENKI SANGYO K.K.) 21-08-84.

PATENT ABSTRACTS OF JAPAN, Vol. 10; No. 82, (E-392) (2139); 4/2/86; & JP-A-60 222 450 (FUJITSU K.K.) 12-11-85.

UNITED STATES PATENT AND TRADEMARK OFFICE
CERTIFICATE OF CORRECTION

PATENT NO. : 4,999,319

DATED : MARCH 12, 1991

INVENTOR(S) : TOSHIO HAMANO ET AL.

It is certified that error appears in the above-identified patent and that said Letters Patent is hereby corrected as shown below:

PATENT ABSTRACTS OF JAPAN, Vol. 7, No. 174 (E-190) (1319); 8/2/83; & JP-A-58 080 845 (HITACHI SEISAKUSHO K.K.) 16-05-83.

PATENT ABSTRACTS OF JAPAN, Vol. 9, No. 321 (E-367) (2044); 12/17/85; & JP-A-60 154 543 (NIPPON DENKI K.K.) 14-08-85.--.

Title page,   Col. 2, [57] ABSTRACT line 10, "fication" should be --fixation--.

Col. 1,   line 8, "Mar. 9," should be --Mar. 19,--.

col. 3, lines 56-57 should read as follows: col.3, line 55, after "co.) delete "the size of": line 56 delete the first occurence of "the"; line 58, after "stages)" insert --. The size of the--."

This Certificate Supersedes Certificate of Correction issued January 19, 1993.

Signed and Sealed this

Thirtieth Day of March, 1993

Attest:

STEPHEN G. KUNIN

Attesting Officer     Acting Commissioner of Patents and Trademarks